US010222697B2

(12) United States Patent
Kishioka et al.

(10) Patent No.: US 10,222,697 B2
(45) Date of Patent: Mar. 5, 2019

(54) PHOTOSENSITIVE FIBER AND METHOD FOR MANUFACTURING SAME

(71) Applicants: NISSAN CHEMICAL INDUSTRIES, LTD., Tokyo (JP); TOYAMA PREFECTURE, Toyama-shi, Toyama (JP)

(72) Inventors: Takahiro Kishioka, Toyama (JP); Yoshiyuki Yokoyama, Toyama (JP)

(73) Assignees: NISSAN CHEMICAL INDUSTRIES, LTD., Tokyo (JP); TOYAMA PREFECTURE, Toyama (JP)

(*) Notice: Subject to any disclaimer, the term of this patent is extended or adjusted under 35 U.S.C. 154(b) by 60 days.

(21) Appl. No.: 15/030,049

(22) PCT Filed: Oct. 17, 2014

(86) PCT No.: PCT/JP2014/077716
§ 371 (c)(1),
(2) Date: Apr. 15, 2016

(87) PCT Pub. No.: WO2015/056789
PCT Pub. Date: Apr. 23, 2015

(65) Prior Publication Data
US 2016/0266492 A1 Sep. 15, 2016

(30) Foreign Application Priority Data

Oct. 17, 2013 (JP) .................................. 2013-216575

(51) Int. Cl.
D01F 6/14 (2006.01)
G03F 7/09 (2006.01)
D01D 5/00 (2006.01)
D01F 1/10 (2006.01)
D01F 2/28 (2006.01)
D01F 6/26 (2006.01)
C08F 220/56 (2006.01)
C08L 3/02 (2006.01)
G03F 7/038 (2006.01)

(52) U.S. Cl.
CPC .............. *G03F 7/09* (2013.01); *C08F 220/56* (2013.01); *C08L 3/02* (2013.01); *D01D 5/003* (2013.01); *D01F 1/10* (2013.01); *D01F 2/28* (2013.01); *D01F 6/26* (2013.01); *G03F 7/038* (2013.01)

(58) Field of Classification Search
CPC ... B01D 5/003; D01F 1/10; D01F 2/28; D01F 6/14; D01F 6/26; D01F 6/34; D01F 6/52; G03F 7/0045; G03F 7/038; G03F 7/0382; C08F 220/20; C08F 220/56; C08L 3/02
USPC .................................................. 430/18, 270.1
See application file for complete search history.

(56) References Cited

U.S. PATENT DOCUMENTS

| 2005/0130055 | A1* | 6/2005 | Ohnishi ................ G03F 7/0392 430/256 |
| 2006/0079658 | A1 | 4/2006 | Kato et al. |
| 2006/0084007 | A1* | 4/2006 | Ratzsch ................... C08K 5/18 430/270.1 |
| 2009/0202945 | A1 | 8/2009 | Nakagawa et al. |
| 2011/0147054 | A1 | 6/2011 | Yamazaki |
| 2011/0287107 | A1 | 11/2011 | Abu Bakar et al. |
| 2011/0300347 | A1* | 12/2011 | Yoon ....................... D04H 1/728 428/195.1 |
| 2013/0343714 | A1* | 12/2013 | Tachibana .......... G02B 6/02395 385/128 |
| 2014/0045119 | A1 | 2/2014 | Kishioka et al. |

FOREIGN PATENT DOCUMENTS

| CN | 1958892 A | 5/2007 |
| CN | 101395189 A | 3/2009 |
| CN | 102789131 A | 11/2012 |
| JP | 2006-133757 A | 5/2006 |
| JP | 2006-328562 A | 12/2006 |
| JP | 2007-044149 A | 2/2007 |
| JP | 2008-119916 A | 5/2008 |
| JP | 2009-057522 A | 3/2009 |
| JP | 2010-145516 A | 7/2010 |
| JP | 2012-514488 A | 6/2012 |
| KR | 10-2013-0042854 A | 4/2013 |
| TW | 201307994 A1 | 2/2013 |
| WO | 2005/095510 A1 | 10/2005 |

OTHER PUBLICATIONS

Steach et al., "Optimization of Electrospinning an SU-8 Negative Photoresist to Create Patterned Carbon Nanofibers and Nanobeads," *Journal of Applied Polymer Science*, 118: 405-412 (2010).
*The 40th Medical Polymer Symposium Proceeding*, pp. 53-54 (2011).

* cited by examiner

*Primary Examiner* — John A McPherson
(74) *Attorney, Agent, or Firm* — Leydig, Voit & Mayer, Ltd.

(57) ABSTRACT

The invention provides a fiber containing (A) a polymer compound containing a structural unit having, in a side chain, at least one kind of organic group selected from a hydroxy group, a hydroxymethyl group and an alkoxymethyl group having 1-5 carbon atoms, and (B) a photoacid generator.

13 Claims, 4 Drawing Sheets

PHOTOSENSITIVE FIBER AND METHOD FOR MANUFACTURING SAME

CROSS-REFERENCE TO RELATED APPLICATIONS

This patent application is the U.S. national phase of International Patent Application No. PCT/JP2014/077716, filed Oct. 17, 2014, which claims the benefit of Japanese Patent Application No. 2013-216575, filed on Oct. 17, 2013, which are incorporated by reference in their entireties herein.

TECHNICAL FIELD

The present invention relates to a photosensitive fiber comprising a particular polymer compound and a photoacid generator and a production method thereof, a fiber pattern using the photosensitive fiber and a production method thereof, and a substrate having the fiber pattern on a surface.

BACKGROUND ART

Conventionally, an ultrafine fiber having a diameter of a nano meter order has been attracting attention, and is expected to be utilizable in various fields of battery•information, environment•energy, medical care•welfare. Particularly, in the medical or research field using cells and the like, for example, utilization of a nano-fiber (nano fiber) or a non-woven fabric thereof as a substrate to be a scaffold for cells has been proposed. Patent document 1 proposes substrates having fiber patterns of nano fiber formed on the surface by a stamp method using a stamp with a given pattern, a stencil method using a template (stencil) having a hole with a given pattern, a spray method for forming a given pattern by using spray and the like. For utilization as a culture substrate and the like for three-dimensional culture and two-layer culture system of cells, patent document 2 proposes a non-woven fabric of nano•micro fiber having minute concave-convex patterns, formed at given positions of a flat plane by using a template having given concaves and convexes, as a substrate for collecting a produced fiber (nano•micro fiber) (collector part), which is a part of an electrospinning apparatus. Patent document 3 proposes production of a temperature responsive fiber having a diameter of a few dozen nano-meter to a few hundred micro-meter, from a polymer solution of a temperature responsive polymer showing varying water-solubility depending on temperature, by dissolving the aforementioned temperature responsive polymer in a solvent and according to a method such as an electrospinning method or a wet method, and a non-woven fabric using same. Also, non-patent document 1 describes production of a nanofiber by introducing a UV crosslinking agent into a given stimuli-responsive polymer, and according to an electrospinning method, and production of a nanofiber mat for capturing or releasing cells, by crosslinking the nanofiber.

However, to realize a cell culture scaffold and the like capable of controlling more functions of cells, formation of a more complicated and fine fiber pattern is necessary. Particularly, it has not been realized in conventional ultrafine fibers (nano•micro fiber) to form a fiber pattern by using a fiber having photosensitivity and directly processing the fiber according to a lithography method.

DOCUMENT LIST

Patent Documents patent document 1: JP-A-2007-44149
patent document 2: JP-A-2006-328562
patent document 3: JP-A-2009-57522

Non-Patent Document non-patent document 1: The 40th Medical Polymer Symposium proceeding p 53-54, 2011

SUMMARY OF THE INVENTION

Problems to be Solved by the Invention

An object of the present invention is to provide a fiber permitting direct form-processing by a convenient method according to a lithography method, and enabling formation of a complicated, fine fiber pattern, and a substrate having a fiber pattern using said fiber on the surface, as well as a production method of these.

Means of Solving the Problems

The present inventors have conducted intensive studies and found that a fiber obtained by spinning a composition comprising a particular polymer compound capable of forming a crosslinked structure by using an acid as a catalyst and a photoacid generator has photosensitivity, and a complicated, fine fiber pattern can be conveniently obtained by subjecting a photosensitive fiber (preferably, a photosensitive fiber obtained by spinning a composition comprising a particular polymer compound capable of forming a crosslinked structure by using an acid as a catalyst and a photoacid generator) to a given lithography treatment, which resulted in the completion of the present invention.

Accordingly, the present invention is as described below.
[1] A fiber comprising
(A) a polymer compound comprising a structural unit having, in a side chain, at least one kind of organic group selected from a hydroxy group, a hydroxymethyl group and an alkoxymethyl group having 1-5 carbon atoms, and
(B) a photoacid generator.
[2] The fiber of [1], wherein the above-mentioned (A) polymer compound comprises (A1) a polymer compound comprising a structural unit represented by the formula (1):

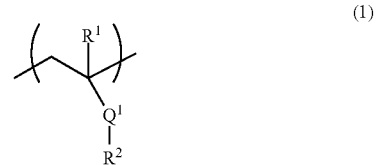

wherein
$R^1$ is a hydrogen atom or a methyl group,
$Q^1$ is an ester bond or an amide bond, and
$R^2$ is an alkyl group having 1-10 carbon atoms or an aromatic hydrocarbon group having 6-10 carbon atoms, wherein at least one hydrogen atom is substituted by a hydroxy group, a hydroxymethyl group or an alkoxymethyl group having 1-5 carbon atoms.

[3] The fiber of [2], wherein the above-mentioned (A1) polymer compound further comprises a structural unit represented by the formula (2):

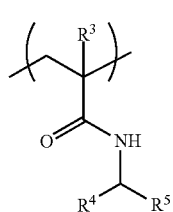

(2)

wherein
R$^3$ is a hydrogen atom or a methyl group,
R$^4$ and R$^5$ are the same or different and each is a hydrogen atom or an alkyl group having 1-4 carbon atoms optionally substituted by a hydroxy group or a carboxy group.

[4] The fiber of [2] or [3], wherein the above-mentioned polymer compound (A1) has a weight average molecular weight of 1,000-1,000,000.

[5] The fiber of [1], wherein the above-mentioned (A) polymer compound is (A2) a natural polymer per se or comprises (A2) a natural polymer.

[6] The fiber of [5], wherein the above-mentioned (A2) natural polymer comprises at least one kind selected from dextrin and a derivative thereof.

[7] The fiber of [5], wherein the above-mentioned (A2) natural polymer comprises a biopolymer.

[8] The fiber of any of [1]-[7], further comprising (C) a crosslinking agent.

[9] The fiber of any of [1]-[8], which is a photosensitive fiber.

[10] The fiber of any of [1]-[9], comprising a nano fiber and/or a micro fiber.

[11] A composition for producing a photosensitive fiber, comprising
(A) a polymer compound comprising a structural unit having, in a side chain, at least one kind of organic group selected from a hydroxy group, a hydroxymethyl group and an alkoxymethyl group having 1-5 carbon atoms,
(B) a photoacid generator, and
(D) a solvent.

[12] The composition of [11], wherein the above-mentioned (A) polymer compound comprises (A1) a polymer compound containing a structural unit represented by the formula (1):

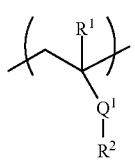

(1)

wherein
R$^1$ is a hydrogen atom or a methyl group,
Q$^1$ is an ester bond or an amide bond, and
R$^2$ is an alkyl group having 1-10 carbon atoms or an aromatic hydrocarbon group having 6-10 carbon atoms, wherein at least one hydrogen atom is substituted by a hydroxy group, a hydroxymethyl group or an alkoxymethyl group having 1-5 carbon atoms.

[13] The composition of [12], wherein the above-mentioned (A1) polymer compound further comprises a structural unit represented by the formula (2):

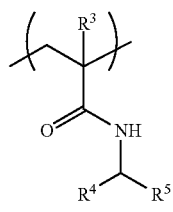

(2)

wherein
R$^3$ is a hydrogen atom or a methyl group, and
R$^4$ and R$^5$ are the same or different and each is a hydrogen atom or an alkyl group having 1-4 carbon atoms optionally substituted by a hydroxy group or a carboxy group.

[14] The composition of [12] or [13], wherein the above-mentioned polymer compound (A1) has a weight average molecular weight of 1,000-1,000,000.

[15] The composition of [11], wherein the above-mentioned (A) polymer compound is (A2) a natural polymer per se or comprises (A2) a natural polymer.

[16] The composition of [15], wherein the above-mentioned (A2) natural polymer comprises at least one kind selected from dextrin and a derivative thereof.

[17] The composition of [15], wherein the above-mentioned (A2) natural polymer comprises a biopolymer.

[18] The composition of any of [11]-[17], further comprising (C) a crosslinking agent.

[19] The composition of any of [11]-[18], wherein a content ratio of the above-mentioned (A) polymer compound is 1-90 wt %.

[20] A production method of a fiber, comprising a step of spinning the composition of any of [11]-[19].

[21] The method of [20], wherein the above-mentioned spinning is electrospinning.

[22] The method of [20] or [21], comprising a step of heating a spun fiber at 70-300° C.

[23] A method of forming a fiber pattern, comprising
the first step for forming a fiber layer of photosensitive fibers on a substrate,
the second step for exposing the fiber layer to light via a mask, and
the third step for developing the fiber layer with a developing solution.

[24] The method of [23], wherein the above-mentioned photosensitive fiber is the fiber of any of [1]-[10].

[25] The method of [23] or [24], wherein the second step comprises heating the fiber after light exposure.

[26] The method of any of [23]-[25], wherein the above-mentioned developing solution comprises water or an organic solvent.

[27] A fiber pattern formed using the fiber of any of [1]-[10].

[28] A substrate having the fiber pattern of [27] on a surface thereof.

[29] A biocompatible material comprising the fiber of any of [1]-[10] or the fiber pattern of [27].

Effect of the Invention

According to the present invention, a photosensitive fiber with which a complicated, fine fiber pattern can be formed by a direct lithography treatment of the fiber can be provided, and a composition for producing the photosensitive fiber can be provided.

According to the present invention, moreover, a complicated, fine fiber pattern can be obtained conveniently, and a substrate having a complicated, fine fiber pattern on its surface can be provided.

Furthermore, application utilizing not only the fiber pattern processed by a lithography treatment, but also, for example, a 100 nm-50 μm random fine pattern of the fiber forming the fiber pattern (e.g., use as an etching mask utilizing an irregular random fine pattern) can be expected.

DESCRIPTION OF EMBODIMENTS

1. Fiber and Production Method Thereof

Figure 1:
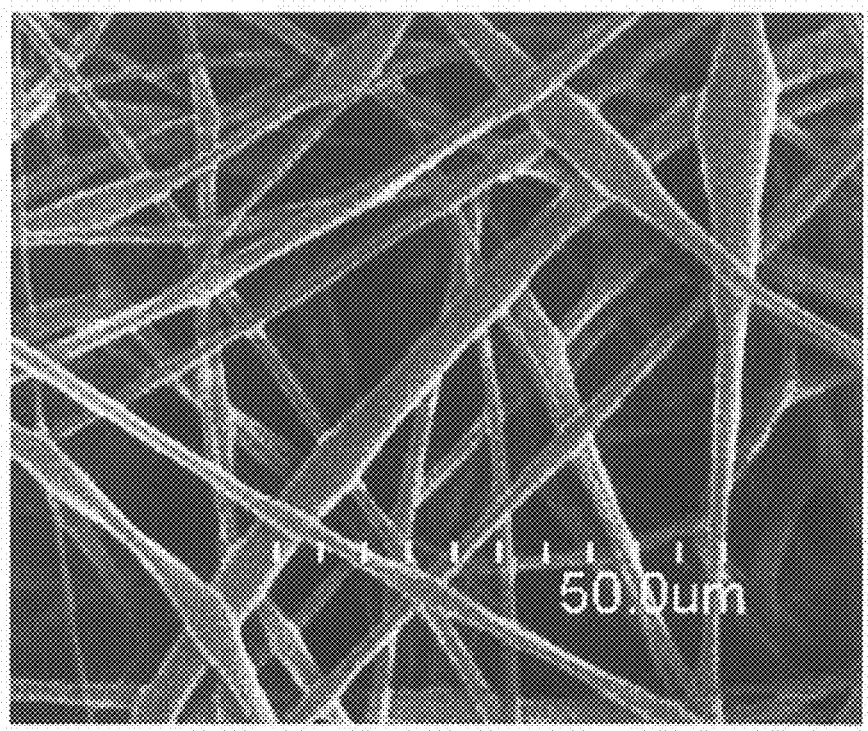
FIG. 1 is an SEM photograph of a fiber layer (after electrospinning (before patterning)) of fibers obtained from the composition for fiber production of Example 1.

The fiber of the present invention is mainly characterized in that it comprises (A) a polymer compound comprising a structural unit having, in a side chain, at least one kind of organic group selected from a hydroxy group, a hydroxymethyl group and an alkoxymethyl group having 1-5 carbon atoms (hereinafter to be referred to as the "polymer compound of component A" or also simply as "component A") and (B) a photoacid generator (hereinafter to be referred to as the "photoacid generator of component B" or also simply as "component B").

That is, the fiber of the present invention is preferably a fiber obtained by spinning (further preferably electrospinning) a starting material composition containing at least the polymer compound of component A and the photoacid generator of component B.

Since the diameter of the fiber of the present invention can be appropriately adjusted according to the use of the fiber and the like, it is not particularly limited. However, from the aspects of application to a substrate to be a scaffold for cells, medical material, cosmetic material, an etching mask in processing various substrates used for display or semiconductor, and the like, the fiber of the present invention is preferably a fiber having a diameter of a nano meter order (e.g., 1-1000 nm) (nano fiber) and/or a micro meter order (e.g., 1-1000 μm) (micro fiber). In the present invention, the diameter of a fiber is measured by a scanning electron microscope (SEM).

Specifically, the diameter of the fiber of the present invention is preferably 10 nm-1000 μm, more preferably 30 nm-500 μm, further preferably 50 nm-100 μm, particularly preferably 100 nm-50 μm.

The length of the fiber of the present invention is desirably not less than 1000 times the diameter of the above-mentioned fiber.

The total weight of the fiber of the present invention is, for example, 10 μg/cm$^2$ or more.

The fiber of the present invention has, what is called, "negative type" photosensitivity. That is, the chemical structure of a part exposed to light changes by crosslinking, and the part becomes insoluble in a developing solution. The photosensitivity is caused by an acid developed from a photoacid generator. In the light exposed part, an acid developed from a photoacid generator causes, for example, an aminoplast crosslinking reaction, which in turn causes intermolecular crosslinking to form a crosslinked structure, thus resulting in the insolubility in the developing solution.

[Component A]

component A is "a polymer compound comprising a structural unit having, in a side chain, at least one kind of organic group selected from a hydroxy group, a hydroxymethyl group and an alkoxymethyl group having 1-5 carbon atoms". It is reacted with at least one kind of organic group selected from a hydroxy group, a hydroxymethyl group and an alkoxymethyl group having 1-5 carbon atoms, using an acid (H$^+$) developed from a photoacid generator as a catalyst, whereby polymer chains are bonded to form a crosslinked structure.

Of such organic groups, a hydroxy group is particularly preferable in view of reactivity.

As used herein, the "alkoxymethyl group having 1-5 carbon atoms" may be linear or branched chain, and concrete examples thereof include methoxymethyl group, ethoxymethyl group, n-propoxymethyl group, isopropoxymethyl group, n-butoxymethyl group, isobutoxymethyl group, sec-butoxymethyl group, tert-butoxymethyl group, n-pentoxymethyl group, isopentoxymethyl group, neopentoxymethyl group, tert-pentoxymethyl group, 1-ethylpropoxymethyl group, 2-methylbutoxymethyl group and the like. The alkoxymethyl group has a carbon atom number of preferably 1-4, more preferably 1-3.

Component A comprises (A1) a polymer compound comprising a structural unit represented by the formula (1):

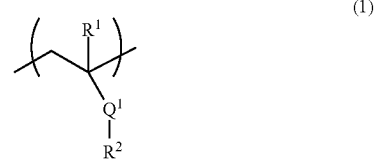

wherein
R$^1$ is a hydrogen atom or a methyl group,
Q$^1$ is an ester bond or an amide bond, and
R$^2$ is an alkyl group having 1-10 carbon atoms or an aromatic hydrocarbon group having 6-10 carbon atoms, wherein at least one hydrogen atom is substituted by a hydroxy group, a hydroxymethyl group or an alkoxymethyl group having 1-5 carbon atoms (hereinafter to be referred to as the "polymer compound of component A1" or also simply as "component A1"), and/or (A2) a natural polymer (hereinafter to be referred to as the "the natural polymer of component A2" or also simply as "component A2").
(Component A1)
The definition of each group in the formula (1) is described in detail in the following.

$R^1$ is a hydrogen atom or a methyl group.

$Q^1$ is an ester bond or an amide bond.

$R^2$ is an alkyl group having 1-10 carbon atoms or an aromatic hydrocarbon group having 6-10 carbon atoms, wherein at least one hydrogen atom is substituted by a hydroxy group, a hydroxymethyl group or an alkoxymethyl group having 1-5 carbon atoms, The "alkoxymethyl group having 1-5 carbon atoms" may be linear or branched chain, and concrete examples thereof include those similar to those mentioned above, and a preferable carbon atom number is also similar to that mentioned above.

The alkyl group having 1-10 carbon atoms may be linear or branched chain, and concrete examples thereof include methyl group, ethyl group, n-propyl group, isopropyl group, n-butyl group, isobutyl group, sec-butyl group, tert-butyl group, n-pentyl group, isopentyl group, neopentyl group, tert-pentyl group, 1-ethylpropyl group, n-hexyl group, isohexyl group, 1,1-dimethylbutyl group, 2,2-dimethylbutyl group, 3,3-dimethylbutyl group, 2-ethylbutyl group, hexyl group, pentyl group, octyl group, nonyl group, decyl group and the like. The number of the carbon atoms of the alkyl group is preferably 1-6, more preferably 1-4.

Examples of the aromatic hydrocarbon group having 6-10 carbon atoms for $R^2$ include phenyl group, 1-naphthyl group, 2-naphthyl group and the like.

Since $R^2$ is reacted as a reactive crosslinking reaction site after exposure of the fiber of the present invention to light, by using a photoacid generator as a catalyst, it is preferably an alkyl group having 1-10 (more preferably 1-6, particularly preferably 1-4) carbon atoms, wherein at least one hydrogen atom is substituted by a hydroxy group, a hydroxymethyl group or an alkoxymethyl group having 1-5 carbon atoms (more preferably a hydroxy group), or a phenyl group wherein at least one hydrogen atom is substituted by a hydroxy group, a hydroxymethyl group or an alkoxymethyl group having 1-5 carbon atoms (more preferably a hydroxy group).

In a preferable structural unit represented by the formula (1), $R^1$ is a hydrogen atom or a methyl group, $Q^1$ is an ester bond, $R^2$ is an alkyl group having 1-10 (more preferably 1-6, particularly preferably 1-4) carbon atoms, wherein at least one hydrogen atom is substituted by a hydroxy group.

The structural unit represented by the formula (1) is preferably a structural unit represented by the formula (1A).

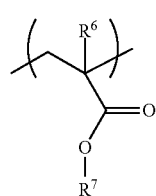

(1A)

wherein $R^6$ is as defined for the above-mentioned $R^1$, and $R^7$ is as defined for the above-mentioned $R^2$.

The component A1 may contain one kind of the structural unit represented by the formula (1), or two or more kinds thereof.

While component A1 may contain a structural unit other than the structural unit represented by the formula (1) as long as the object of the present invention is not impaired, the content ratio of the structural unit represented by the formula (1) to the total structural unit of component A1 is preferably not less than 5 mol %, more preferably not less than 15 mol %, from the aspects of the efficiency of the crosslinking reaction.

Examples of the structural unit other than the structural unit represented by the formula (1) include a structural unit represented by the formula (2):

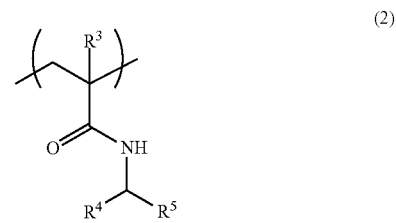

(2)

wherein $R^3$ is a hydrogen atom or a methyl group, $R^4$ and $R^5$ may be the same or different and each is a hydrogen atom or an alkyl group having 1-4 carbon atoms, which is optionally substituted by a hydroxy group or a carboxy group.

Component A1 may contain one kind of the structural unit represented by the formula (2), or two or more kinds thereof.

The "alkyl group having 1-4 carbon atoms" for $R^4$ or $R^5$ in the formula (2) may be linear or branched chain. Concrete examples thereof include methyl group, ethyl group, n-propyl group, isopropyl group, n-butyl group, and isobutyl group.

In the present invention, being "optionally substituted by a hydroxy group or a carboxy group" means that a hydrogen atom contained in the above-mentioned "alkyl group having 1-4 carbon atoms" is optionally partly or entirely substituted by a hydroxy group or a carboxy group.

In the structural unit represented by the formula (2), $R^3$ is a hydrogen atom or a methyl group, and $R^4$ and $R^5$ are more preferably methyl groups.

The weight average molecular weight of component A1 is preferably 1,000-1,000,000, more preferably 5,000-500,000, particularly preferably 10,000-200,000, from the aspects of the fiber property and photosensitive property during electrospinning. In the present invention, the "weight average molecular weight" refers to a molecular weight based on polystyrene, which is measured by gel permeation chromatography (GPC).

Component A1 may be used alone, or two or more kinds thereof may be used in combination.

Component A1 can be produced by a method known per se or a method analogous thereto. For example, it can be produced by polymerizing a monomer corresponding to each structural unit (a monomer corresponding to the structural unit represented by the formula (1), a structural unit other than the structural unit represented by the formula (1) (preferably a monomer corresponding to the structural unit represented by the formula (2)) in a suitable solvent (e.g., propylene glycol monoethyl ether etc.) by using a suitable polymerization initiator (e.g., 2,2'-azobisisobutyronitrile etc.), but the method is not limited thereto. In addition, a commercially available product can also be used.

Examples of the monomer corresponding to the structural unit represented by the formula (1) include 2-hydroxyethyl (meth)acrylate (e.g., compound of CAS number: 868-77-9), 2-hydroxypropyl (meth)acrylate (e.g., compound of CAS number: 923-26-2), 4-hydroxybutyl (meth)acrylate (e.g., compound of CAS number: 2478-10-6), N-hydroxymethyl (meth)acrylamide (e.g., compound of CAS number: 923-02-4), N-(2-hydroxyethyl) (meth)acrylamide (e.g., compound of CAS number: 5238-56-2), N-(2-hydroxypropyl) (meth)acrylamide (e.g., compound of CAS number: 26099-09-2), p-hydroxy (meth)acrylic anilide (e.g., compound of CAS number: 19243-95-9), N-methoxymethyl (meth)acrylamide, N-butoxymethyl (meth)acrylamide and the like. Preferred is 2-hydroxyethyl (meth)acrylate, 2-hydroxypropyl (meth)acrylate, N-methoxymethyl (meth)acrylamide, or N-butoxymethyl (meth)acrylamide, and most preferred is 2-hydroxyethyl (meth)acrylate.

In the present invention, the (meth)acrylate compound refers to both an acrylate compound and a methacrylate compound. For example, (meth)acrylic acid refers to both acrylic acid and methacrylic acid.

Examples of the monomer corresponding to the structural unit represented by the formula (2) include N-isopropyl (meth)acrylamide, N-(1-methylpropyl) (meth)acrylamide, N-(1-ethylpropyl) (meth)acrylamide, N-(1-propylbutyl) (meth)acrylamide, N-(1-butylpentyl) (meth)acrylamide, 2-carboxyisopropyl (meth)acrylamide, 2-hydroxyisopropyl (meth)acrylamide and the like, and N-isopropyl (meth)acrylamide, 2-carboxyisopropyl (meth)acrylamide or 2-hydroxyisopropyl (meth)acrylamide is most preferable.

When component A1 has a structural unit represented by the formula (2), as shown in the below-mentioned Examples, the fiber of the present invention shows temperature responsiveness. In this case, the content ratio of the structural unit represented by the formula (2) to the total structural unit of component A1 is preferably 60-95 mol %. Since the fiber of the present invention shows temperature responsiveness, for example, a fiber pattern with varying sizes in response to the temperature can be formed. Such fiber and fiber pattern are advantageous in that application to, for example, (i) a drug delivery system (DDS) and a medicament sheet capable of keeping or releasing water, medicament and the like in or from the fiber, (ii) a filter and the like capable of controlling passage of substances by increasing or decreasing the fiber diameter, (iii) a device and the like capable of controlling attachment of substances by controlling hydrophobicity/hydrophilicity of the surface, and the like can be expected.

(Component A2)

The natural polymer of component A2 is not particularly limited as long as it is a natural polymer containing a structural unit having, in a side chain, at least one kind of organic group selected from a hydroxy group, a hydroxymethyl group and an alkoxymethyl group having 1-5 carbon atoms, and capable of forming a crosslinked structure by a reaction with an acid. The natural polymer used in the present invention may be a natural polymer per se, or a denatured natural polymer obtained by a reaction such as hydrolysis and the like of a natural polymer. The natural polymer used in the present invention is preferably dextrin which is a hydrolysate of starch or glycogen, or a derivative thereof. Here, the dextrin derivative is a dextrin wherein a hydroxy group is partly or entirely substituted by a substituent (e.g., acetoxy group, benzoyl group etc.).

In the present invention, a biopolymer (including denatured biopolymer) may be used as a natural polymer. In the present specification, the "biopolymer" is a generic term for polymers derived from living organisms.

The weight average molecular weight of component A2 is preferably 1,000-5,000,000, more preferably 1,000-100,000.

Component A2 may be any one kind to be used alone, or two or more kinds thereof may be used in combination.

(Component A3)

Furthermore, (A) polymer compound may contain any third component (component A3). Component A3 is not particularly limited as long as it can polymerize with the above-mentioned component A1 and/or component A2, without impairing the properties of the fiber of the present invention and the like. Examples thereof include (meth)acrylates wherein the alkyl group has 1-10 carbon atoms, benzyl (meth)acrylate, acrylamides (e.g., acrylamide, N-alkylacrylamide, N-arylacrylamide, N,N-dialkylacrylamide, N,N-diarylacrylamide, N-methyl-N-phenylacrylamide, N-2-acetamidoethyl-N-acetylacrylamide etc.), methacrylamides (e.g., methacrylamide, N-alkylmethacrylamide, N-arylmethacrylamide, N,N-dialkylmethacrylamide, N,N-diarylmethacrylamide, N-methyl-N-phenylmethacrylamide, N-ethyl-N-phenylmethacrylamide etc.).

When, for example, (meth)acrylates wherein the alkyl group has 1-10 carbon atoms, benzyl (meth)acrylate and the like, having a hydrophobic side chain, are used as component A3, the hydrophilicity-hydrophobicity balance of (A) polymer compound can be adjusted.

Component A3 may be any one kind to be used alone, or two or more kinds thereof may be used in combination.

[Component B]

The photoacid generator of component B is not particularly limited as long as it is a compound that directly or indirectly develops an acid by exposure to light. Examples thereof include diazomethane compound, onium salt compound, sulfonimide compound, nitrobenzyl compound, iron arene complex, benzointosylate compound, halogen-containing triazine compound, oxime sulfonate compound containing a cyano group and the like.

Examples of the diazomethane compound include bis(p-toluenesulfonyl)diazomethane, bis(1,1-dimethylethylsulfonyl)diazomethane, bis(cyclohexylsulfonyl)diazomethane, bis(2,4-dimethylphenylsulfonyl)diazomethane and the like.

Examples of the onium salt compound include bis(4-t-butylphenyl)iodonium trifluoromethanesulfonate, triphenylsulfonium trifluoromethanesulfonate and the like.

Examples of the sulfonimide compound include N-(trifluoromethanesulfonyloxy)succinimide, N-(nonafluoro-normal butanesulfonyloxy)succinimide, N-(camphorsulfonyloxy) succinimide, N-(trifluoromethanesulfonyloxy) naphthalimide and the like.

Examples of the nitrobenzyl compound include 2-nitrobenzyl p-toluenesulfonate, 2,6-dinitrobenzyl p-toluenesulfonate, 2,4-dinitrobenzyl p-toluenesulfonate and the like.

Examples of the iron arene complex include biscyclopentadienyl-($\eta^6$-isopropylbenzene)-iron(II) hexafluorophosphate and the like.

Examples of the benzointosylate compound include benzointosylate, α-methylbenzointosylate and the like.

Examples of the halogen-containing triazine compound include 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine and the like.

Examples of the oxime sulfonate compound containing a cyano group include α-(methylsulfonyloxyimino)-4-methoxybenzyl cyanide, α-(trifluoromethylsulfonyloxyimino)-4-methoxybenzyl cyanide, α-(ethylsulfonyloxyimino)-4-methoxybenzyl cyanide, α-(propylsulfonyloxyimino)-4-methylbenzyl cyanide and the like.

Component B is preferably an oxime sulfonate compound containing a cyano group, and particularly preferably α-(methylsulfonyloxyimino)-4-methoxybenzyl cyanide.

Component B may be any one kind to be used alone, or two or more kinds thereof may be used in combination. Component B can be produced by a method known per se or a method analogous thereto. In addition, a commercially available product may also be used.

[Component C]

The fiber of the present invention can further contain a crosslinking agent (hereinafter to be referred to as the "crosslinking agent of component C" or also simply as "component C").

As the crosslinking agent of component C, any compound having, in one molecule, two or more organic groups capable of reacting with at least one kind of organic group possessed by component A, which is selected from a hydroxy group, a hydroxymethyl group and an alkoxymethyl group having 1-5 carbon atoms, by using an acid ($H^+$) developed by the photoacid generator of component B as a catalyst can be used without any particular limitation. Preferred is a compound having 3 or 4 organic groups, more preferably 4 organic groups, in one molecule.

Specific examples thereof include aminoplast crosslinking agents such as 1,3,4,6-tetrakis(methoxymethyl)glycoluril, 1,3,4,6-tetrakis(butoxy methyl)glycoluril and the like; phenoplast crosslinking agents such as 2,2-bis(4-hydroxy-3,5-dihydroxymethylphenyl)propane and the like; isocyanate crosslinking agents such as hexamethylene diisocyanate and the like; vinylether crosslinking agents such as 1,4-bis(vinyloxy)butane and the like; and the like.

Component C is preferably an aminoplast crosslinking agent, which is preferably 1,3,4,6-tetrakis(hydroxymethyl) glycoluril (CAS number: 5395-50-6), 1,3,4,6-tetrakis (methoxymethyl)glycoluril (CAS number: 17464-88-9), 1,3, 4,6-tetrakis(ethoxymethyl)glycoluril (CAS number: 65952-06-9), 1,3,4,6-tetrakis(1-methylethoxy)glycoluril (CAS number: 508220-69-7), 1,3,4,6-tetrakis(1,1-dimethylethoxy)glycoluril (CAS number: 547744-08-1) or 1,3,4,6-tetrakis(butoxymethyl)glycoluril (CAS number: 15968-37-3), more preferably 1,3,4,6-tetrakis(methoxymethyl) glycoluril.

Component C may be any one kind to be used alone, or two or more kinds thereof may be used in combination. Component C can be produced by a method known per se or a method analogous thereto. In addition, a commercially available product may also be used.

Since the fiber of the present invention contains component C, when component B develops an acid ($H^+$), not only a crosslinked structure resulting from a reaction of polymer chains of the polymer compound of component A, but also a reaction of three-dimensional crosslinking of polymer chains of the polymer compound of component A via the crosslinking agent of component C proceed.

The fiber of the present invention is preferably produced by preparing a composition containing the polymer compound of component A and the photoacid generator of component B, or the polymer compound of component A, the photoacid generator of component B and the crosslinking agent of component C, and further, (D) a solvent (hereinafter to be referred to as the "solvent of component D" or also simply as "component D") (that is, the composition for producing a photosensitive fiber of the present invention (hereinafter to be also simply referred to as "the composition of the present invention") and spinning the composition.

The solvent of component D is not particularly limited as long as it can uniformly dissolve or disperse components A and B, or components A, B and C, and does not react with each component. From the aspects of solubility of components A and B, a polar solvent is preferable.

Examples of the polar solvent include water, methanol, ethanol, 2-propanol, propylene glycol monomethyl ether, acetone, dimethylformamide, dimethylacetamide, N-methylpyrrolidone and the like. Preferred for easy spinning of the composition is propylene glycol monomethyl ether.

Component D may be used alone, or two or more kinds thereof may be used in combination.

The content ratio of component A in the composition of the present invention is preferably 1-90 wt %, more preferably 5-70 wt %, from the aspects of the production of a fiber having an appropriate thickness, and the preservation stability of the composition of the present invention.

The content ratio of component B in the composition of the present invention is preferably 0.1-50 wt %, more preferably 0.5-40 wt %, particularly preferably 1-20 wt %, to maintain the property of the temperature responsive resin.

The weight ratio of component A and component B (weight of component A/weight of component B) in the composition of the present invention is preferably 5-50, more preferably 10-40, from the aspects of the reaction efficiency of component A and component B.

The content ratio of component C in the composition of the present invention is preferably 0.1-15 wt %, more preferably 0.3-10 wt %, particularly preferably 0.5-5, from the aspects of the reaction efficiency with component A.

The composition of the present invention may contain, as necessary besides components A-D, an additive generally used for a composition for fiber production as long as the object of the present invention is not markedly impaired. Examples of the additive include surfactant, rheology adjusting agent, chemical agent, fine particles and the like.

The composition of the present invention can be prepared by mixing the above-mentioned components A, B and D, or components A-D or components A-D and the above-mentioned additive. The mixing method is not particularly limited, and a method known per se or a method analogous thereto can be used for mixing.

The spinning method of the composition of the present invention is not particularly limited as long as it can form a fiber. For example, melt blow method, composite melt spinning method, electrospinning method and the like can be mentioned, and electrospinning method is preferable from the aspect of the ultrafine fiber (nano fiber, micro fiber) forming ability.

Electrospinning method is a known spinning method, and can be performed using a known electrospinning apparatus. Various conditions such as the speed of discharge of the composition of the present invention from the tip of a nozzle (e.g., needle etc.) (discharge speed); application voltage; the distance between the tip of a nozzle discharging the composition of the present invention and a substrate for receiving same (discharge distance) and the like can be appropriately determined according to the diameter of the fiber to be produced and the like. The discharge speed is generally 0.1-100 μl/min, preferably 0.5-50 μl/min, more preferably 1-20 μl/min. The application voltage is generally 0.5-80 kV, preferably 1-60 kV, more preferably 3-40 kV. The discharge distance is generally 1-60 cm, preferably 2-40 cm, more preferably 3-30 cm.

The electrospinning method may be performed using a drum collector and the like. Using a drum collector and the like, the orientation of the fiber can be controlled. For example, when the drum is rotated at a low speed, a non-woven fabric and the like can be obtained, and when it is rotated at a high speed, an orientational fiber sheet and the like can be obtained. This is effective for forming an etching mask material and the like in processing semiconductor materials.

The production method of the fiber of the present invention preferably further includes, in addition to the aforementioned spinning step, a step of heating the spun fiber at a particular temperature.

The temperature for heating a spun fiber is generally 70-300° C. From the aspects of the heat resistance of component A, it is preferably 80-250° C., more preferably 90-200° C. When the temperature is less than 70° C., the crosslinking reaction of components A becomes insufficient, and the produced fiber tends to show lower resistance to organic solvents. When it exceeds 300° C., component A itself undergoes decomposition or dissolution due to the heat and the like, and a fiber cannot be formed.

The heating method of the spun fiber is not particularly limited as long as heating at the above-mentioned heating temperature is possible, and a method known per se or a method analogous thereto can be appropriately used for heating. Specific examples of the heating method include a method using a hot plate, oven and the like under atmosphere, and the like.

While the heating time of the spun fiber can be appropriately determined according to the heating temperature and the like, it is preferably for 1 min—for 48 hr, more preferably for 5 min—for 36 hr, particularly preferably for 10 min—for 24 hr from the aspects of crosslinking reaction rate, and production efficiency.

The fiber of the present invention shows photosensitivity. Therefore, it can be used as a medical material, a cosmetic material or an etching mask material for processing a semiconductor material and the like. Particularly, a nano fiber and a micro fiber are preferable for a cell culture substrate having a pattern (biomimetic, for example, a substrate for coculture with blood vessel cells etc. to prevent degradation of cultured cells etc.), an etching mask having fine pores and the like.

2. Fiber Pattern and Substrate Having Fiber Pattern

Since the fiber of the present invention shows photosensitivity, when a fiber layer of a fiber assembly is formed, and the fiber layer is directly subjected to a lithography treatment, light unexposed parts are removed, and a fiber pattern, in which the fibers in the light exposed parts are insolubilized by crosslinking and remain, can be formed. A complicated, fine fiber pattern can be formed by applying a lithography treatment to a fiber layer of nano fibers and/or micro fibers.

The fibers in the fiber layer are one-dimensionally, two-dimensionally or three-dimensionally assembled, and the assembly state may or may not show regularity. The "pattern" in the present invention refers to something recognized as a spacial shape of an object such as design, markings and the like, which mainly consists of straight lines, curves and combination of these. The pattern may have any shape, and the pattern itself may or may not show regularity.

The present invention provides a method of forming a fiber pattern, comprising the first step for forming a fiber layer of photosensitive fibers (preferably, the fiber of the present invention) on a substrate, the second step for exposing the fiber layer to light via a mask, and the third step for developing the fiber layer with a developing solution.

[First Step]

The first step is a step for forming a fiber layer of photosensitive fibers (preferably, the fiber of the present invention) on a substrate.

A method for forming a fiber layer of photosensitive fibers (preferably, the fiber of the present invention) on a substrate is not particularly limited and, for example, a fiber layer may be formed by directly spinning the composition of the present invention on a substrate.

The substrate is not particularly limited as long as it is made from a material that does not cause deformation, denaturation and the like during a lithography treatment and, for example, substrate made of glass, ceramics, plastic, a semiconductor such as silicon and the like, film, sheet, plate, fabric (woven fabric, knitted fabric, non-woven fabric), thread and the like, and the like can be used.

While the fabric weight after formation of a fiber pattern in a fiber layer (amount per unit area of substrate) is not particularly limited, for example, it may be an amount for forming a fiber layer having a thickness of about 5 μm-50 μm, like the fiber pattern (FIG. 3) formed in the below-mentioned Examples.

[Second Step]

The second step is a step for exposing the fiber formed on a substrate in the above-mentioned first step, to light via a mask. The light exposure can be performed, for example, using g-ray (wavelength 436 nm), h-ray (wavelength 405 nm), i-ray (wavelength 365 nm), mercury lamp, various laser, LED and the like.

After light exposure, the fiber may be heated as necessary (Post Exposure Bake: PEB). By heating the fiber, the light exposed part has higher molecular weight than the light unexposed part, which is due to the action of an acid developed by exposure to light. As a result, the difference in the solubility in a developing solution between the light exposed part and the light unexposed parts becomes greater, and an effect of improved resolution contrast can be obtained. While the heating temperature can be appropriately set according to the heating time and the like, it is generally 80-200° C. While the heating time can be appropriately set according to the heating temperature and the like, it is generally 1-20 min.

[Third Step]

The third step is a step for developing the fiber exposed to light and heated as necessary in the above-mentioned second step in a developing solution. As the developing solution, a developing solution generally used for forming a pattern of a photosensitive composition can be used as appropriate. A developing solution capable of dissolving a photoacid generator, an uncrosslinked crosslinking agent and the like contained in the fiber of the present invention is preferable. The developing solution used in the above-mentioned third step more preferably contains water or an organic solvent.

The water may be water alone, or various aqueous alkaline solutions (e.g., aqueous solutions of alkalis, for example, inorganic alkalis such as sodium hydroxide, potassium hydroxide, sodium carbonate, sodium silicate, metasilicate sodium, aqueous ammonia and the like; first amines such as ethylamine, N-propylamine and the like; second amines such as diethylamine, di-N-butylamine and the like; third amines such as triethylamine, methyldiethylamine and the like; alcohol amines such as dimethylethanolamine, triethanolamine and the like; quaternary ammonium salts such as tetramethylammonium hydroxide, tetraethylammonium hydroxide, choline and the like; cyclic amines such as pyrrole, piperidine and the like; and the like.

Examples of the organic solvent include alcohols (e.g., 1-butanol, 2-butanol, isobutyl alcohol, tert-butyl alcohol, 1-pentanol, 2-pentanol, 3-pentanol, 1-heptanol, 2-heptanol, tert-amyl alcohol, neopentyl alcohol, 2-methyl-1-propanol, 2-methyl-1-butanol, 2-methyl-2-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-butoxy-2-propanol and cyclohexanol etc.) and solvents generally used for resist composition and the like (e.g., ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methylethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate etc.) and the like.

The developing solution to be used in the third step is preferably water, ethyl lactate or an aqueous solution of tetramethylammonium hydroxide, and water or ethyl lactate is particularly preferable. The pH of the developing solution is preferably near neutral (e.g., 6-8) or basic (e.g., 9-14), and the developing solution may contain an additive such as surfactant and the like.

The fiber pattern of the present invention produced on a substrate by the above-mentioned steps is used together with the substrate or separated from the substrate and used.

When the fiber pattern is used together with the substrate (that is, a substrate having a fiber pattern on the surface, of the present invention), a substrate having a fiber pattern formed using a nano fiber and/or a micro fiber can be preferably used as a cell culture scaffold material, an etching mask used for processing a substrate such as semiconductor and the like, and the like. When used as a cell culture scaffold material, the substrate is preferably made of glass or plastic.

When the fiber pattern is formed using fibers obtained using the natural polymer of component A2 (preferably, biopolymer etc.) as the whole or a part of the polymer compound of component A, the substrate having a fiber pattern on the surface, of the present invention can be preferably used as a wound covering material, a face mask (for cosmetic, hygienic management) and the like.

The biocompatible material of the present invention includes a fiber or a fiber pattern (preferably, a fiber obtained using component A1 alone as the polymer compound of component A or a fiber pattern using said fiber, and a fiber obtained using the natural polymer of component A2 (preferably, biopolymer etc.) as the whole or a part of the polymer compound of component A, or a fiber pattern using said fiber).

EXAMPLES

While specific examples of the present invention are explained below, the present invention is not limited in any way by the examples.

[Measurement of Weight Average Molecular Weight]

In the Examples, the weight average molecular weight of polymer is measured by gel permeation chromatography (GPC). The apparatus used for the measurement and measurement conditions are as follows.

apparatus: TOSOH HLC-8320GPC system
column: Shodex (registered trade mark) KF-803 L, KF-802 and KF-801
column temperature: 40° C.
eluent: DMF
flow rate: 0.6 ml/min
detector: RI
standard sample: polystyrene

[Production Method of Fiber by Electrospinning Method]

In the Examples, fibers were produced by an electrospinning method by using Esprayer ES-2000 (manufactured by Fuence Co., Ltd.). The composition for fiber production was filled in a 1 ml lock-type glass syringe (manufactured by AS ONE Corporation), and a lock-type metallic needle 24 G with needle length of 13 mm (manufactured by Musashi engineering) was attached. The distance from the needle tip to the substrate for receiving the fiber (discharge distance) was set to 20 cm. The applied voltage was 25 kV, and the discharge speed was 10 μl/min.

<Synthesis of Polymer 1>

N-isopropylacrylamide (20.0 g, 0.177 mol), 2-hydroxyethyl acrylate (5.13 g, 0.044 mol) and 2,2'-azobisisobutyronitrile (manufactured by Wako Pure Chemical Industries, Ltd.) (0.25 g) were dissolved in propylene glycol monomethyl ether (25.1 g) and reacted under a nitrogen atmosphere at 80° C. for 24 hr to give a solution containing polymer 1. Assuming the reaction proceeded as charged, the content ratio of the structural unit derived from N-isopropylacrylamide to the whole structural unit of polymer 1 is 80 mol %, and the content ratio of the structural unit derived from 2-hydroxyethyl acrylate is 20 mol %. The weight average molecular weight of polymer 1 based on polystyrene was 19,000.

Preparation of Composition for Producing Photosensitive Fiber

Example 1

To a solution (2 g) containing polymer 1 were added α-(methylsulfonyloxyimino)-4-methoxybenzyl cyanide (trade name: PAI-1001, manufactured by Midori Kagaku Co., Ltd.) (0.05 g), 1,3,4,6-tetrakis(methoxymethyl)glycoluril (0.015 g) and propylene glycol monomethyl ether (PGME) (0.597 g) to prepare a composition for producing a photosensitive fiber of Example 1. The content ratio of solids (polymer 1, α-(methylsulfonyloxyimino)-4-methoxybenzyl cyanide and 1,3,4,6-tetrakis(methoxymethyl)glycoluril) in the composition for producing a photosensitive fiber is about 40 wt %.

Example 2

A dextrin derivative (product name: GS-AB1, ratios of terminal groups of dextrin: hydroxy group 30%, acetoxy group 52.5%, benzoyl group 17.5%, manufactured by Gun Ei Chemical Industry Co., Ltd., weight average molecular weight: 3,920) (1.5 g), α-(methylsulfonyloxyimino)-4-methoxybenzyl cyanide (trade name: manufactured by PAI-1001, Midori Kagaku Co., Ltd.) (0.075 g), 1,3,4,6-tetrakis(methoxymethyl)glycoluril (0.225 g) and PGME (1.2 g) were added to prepare a composition for producing a photosensitive fiber of Example 2. The content ratio of solids (dextrin derivative, α-(methylsulfonyloxyimino)-4-methoxybenzyl cyanide and 1,3,4,6-tetrakis(methoxymethyl)glycoluril) in the composition for producing a photosensitive fiber is about 60 wt %.

Comparative Example 1

Figure 2:
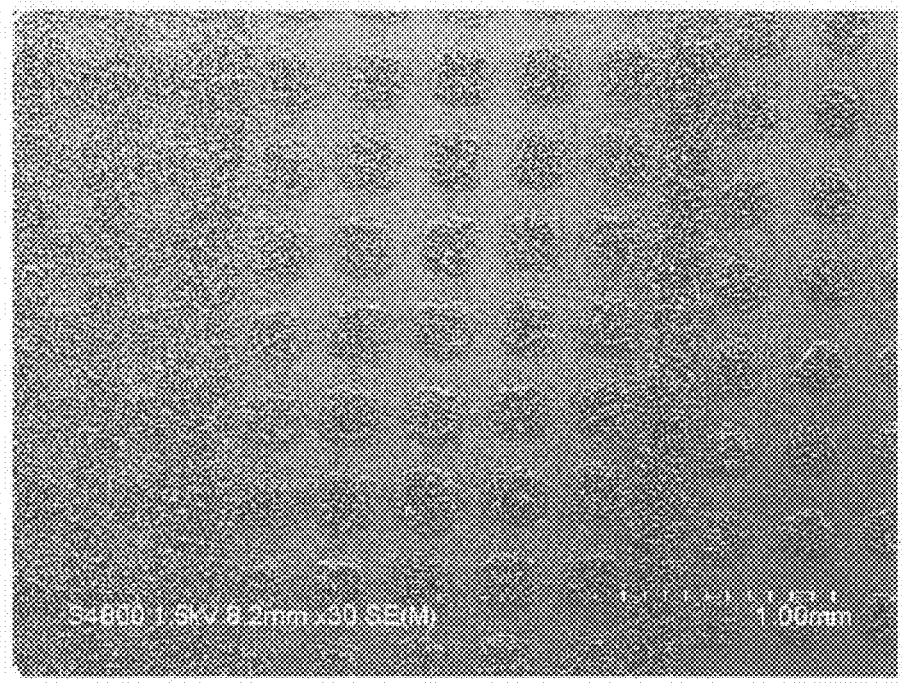
FIG. 2 is an SEM photograph of a fiber pattern formed using fibers obtained from the composition for fiber production of Example 1.
Figure 3:
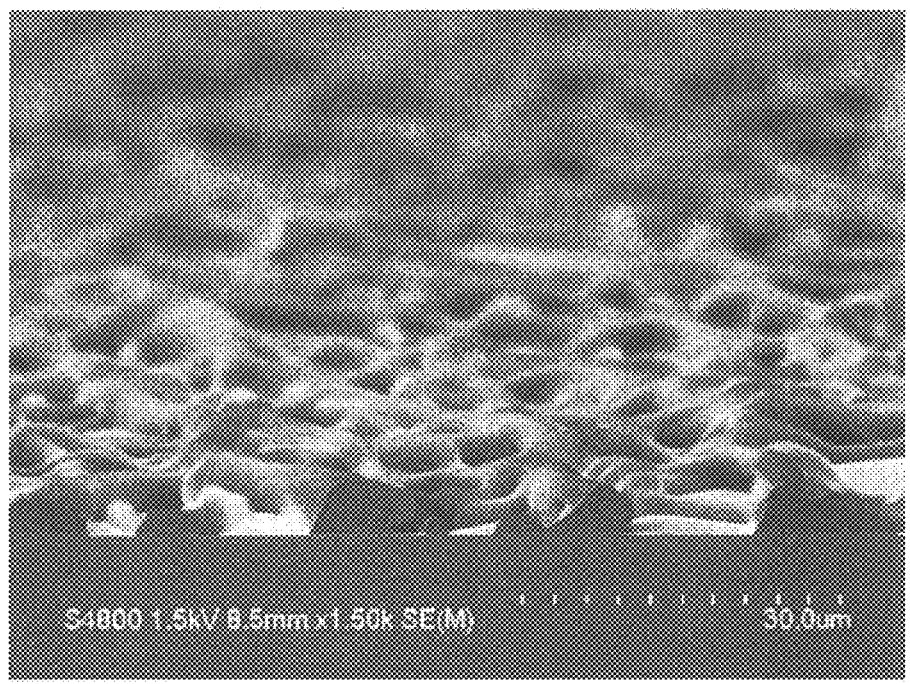
FIG. 3 is an SEM photograph (partly enlarged section) of a fiber pattern formed using fibers obtained from the composition for fiber production of Example 1.
Figure 4:
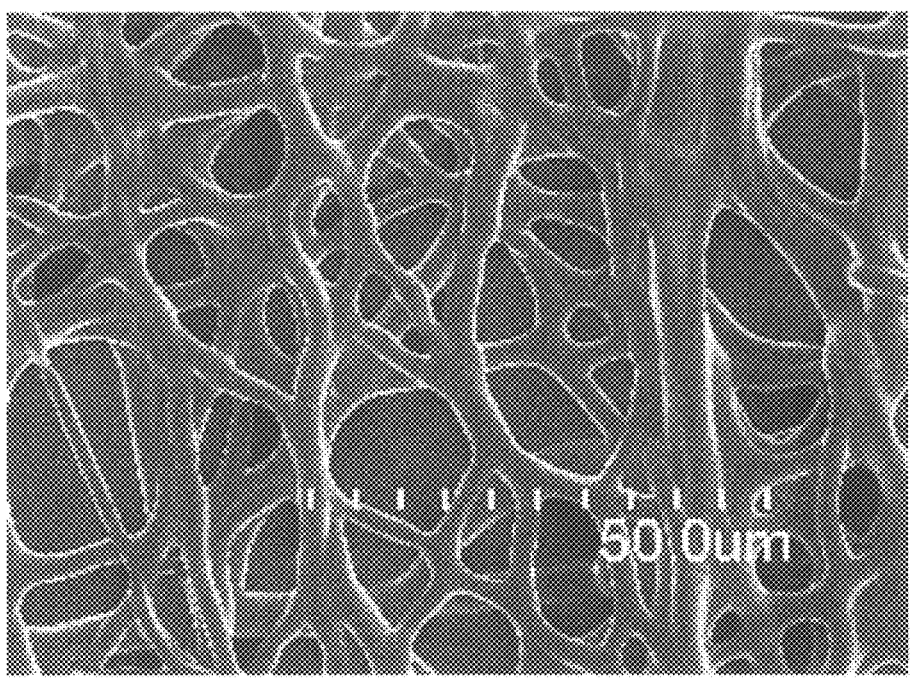
FIG. 4 is an SEM photograph (partly enlarged fiber part of FIG. 3) of a fiber pattern formed using fibers obtained from the composition for fiber production of Example 1.

In the same manner as in Example 1 except that α-(methylsulfonyloxyimino)-4-methoxybenzyl cyanide was not added, a composition for producing a photosensitive fiber of Comparative Example 1 was prepared.
<Patterning Test>
The composition for producing a photosensitive fiber of Example 1 was spun on a silicon wafer by an electrospinning method into fibers having a diameter of about 1-5 μm to form a fiber layer. The fiber layer was photographed by a scanning electron microscope (SEM) (S-4800, manufactured by Hitachi High-Technologies Corporation) and the photograph is shown in FIG. 1. Then, the fiber layer was exposed to light via a mask by using an i-ray aligner PLA-501 (manufactured by Canon Inc., light exposure amount: 1000 mJ/cm$^2$). After exposure to light, the fiber layer was heated (PEB) on a hot plate at 140° C. for 5 min, and exposed to water for 10 min. Thereafter, the fiber layer was dried by heating at 100° C. for 1 min to give a fiber pattern (200 μm×200 μm). An SEM photograph of the fiber pattern is shown in FIG. 2. In addition, an SEM photograph of a partial section of the fiber pattern is shown in FIG. 3, and an SEM photograph of a fiber part of the fiber pattern (partly enlarged fiber part of FIG. 3) is shown in FIG. 4.

Figure 5:
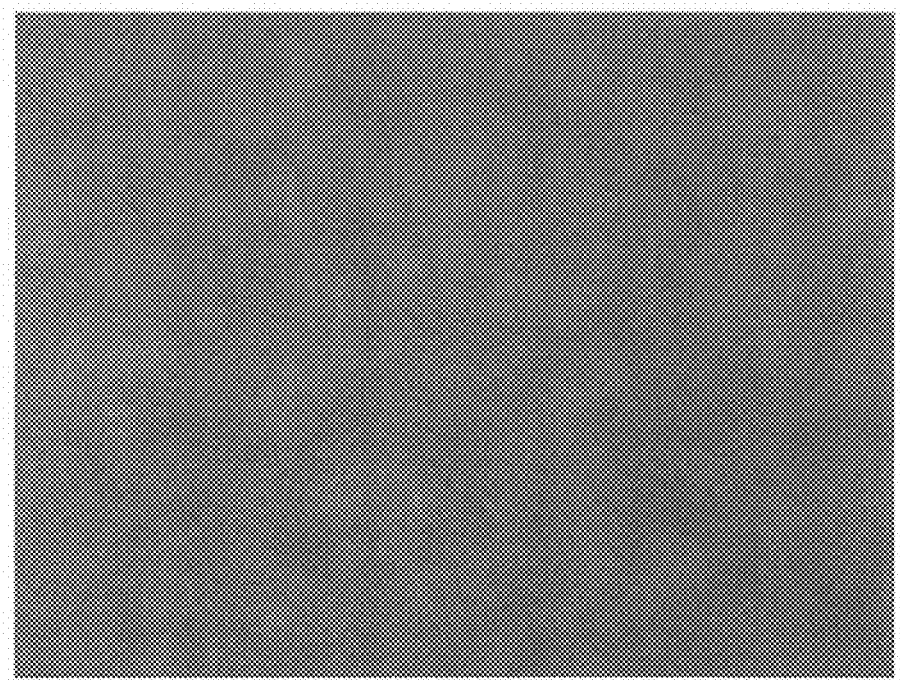
FIG. 5 is an optical microscopic photograph of a fiber obtained from the composition for fiber production of Example 1 and after immersing in water at 20° C. for 10 min.
Figure 6:
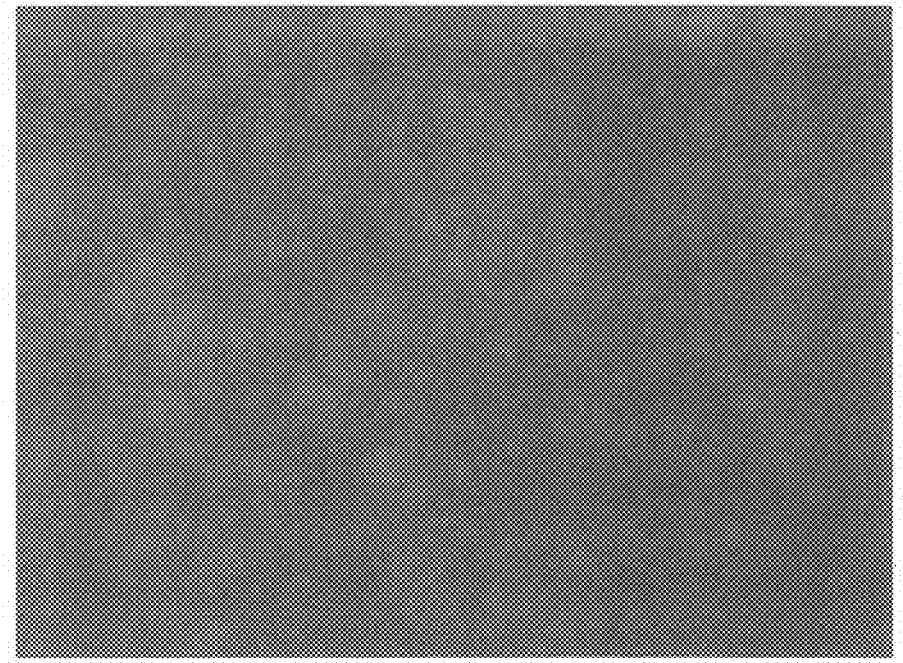
FIG. 6 is an optical microscopic photograph of a fiber obtained from the composition for fiber production of Example 1 and after immersing in water at 40° C. for 10 min.
Figure 7:
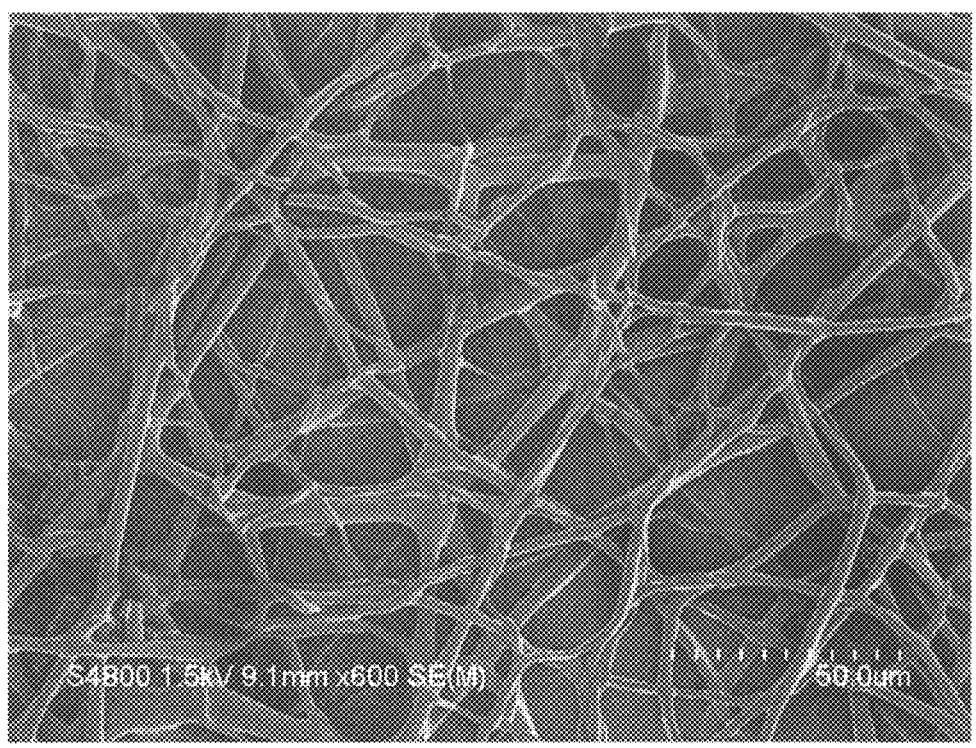
FIG. 7 is an SEM photograph of a fiber layer (after electrospinning (before patterning) of fibers obtained from the composition for fiber production of Example 2.

Using the composition for producing a photosensitive fiber of Comparative Example 1, a patterning test was performed in the same manner as in Example 1. However, when the fiber after light exposure was exposed to water, the fiber was dissolved in water. Thus, a fiber pattern was not obtained.
<Temperature Responsiveness of Fiber>
The composition for producing a photosensitive fiber of Example 1 was spun by an electrospinning method into fibers having a diameter of about 1-5 μm to form a fiber layer of the fibers on a silicon wafer. Then, the fibers were immersed in water at 20° C. and 40° C. for 10 min, and the state of the fiber was observed by an optical microscope (FIGS. 5 and 6). As a result of the observation, the fiber swelled at 20° C., and shrank at 40° C. Therefore, the fiber was shown to have temperature responsiveness.
<Formation of Fiber Layer>
The composition for producing a photosensitive fiber of Example 2 was spun by an electrospinning method to form a fiber layer and the fiber layer was exposed to light by using an i-ray aligner PLA-501 (manufactured by Canon Inc., light exposure amount: 1000 mJ/cm$^2$). After exposure to light, the fiber layer was subjected to PEB (Post Exposure Bake) at 120° C. for 20 min, immersed in PGME at room temperature for 1 min and dried by heating at 100° C. for 30 min. An SEM photograph of the fiber layer is shown in FIG. 7.

INDUSTRIAL APPLICABILITY

According to the present invention, a photosensitive fiber with which a complicated, fine fiber pattern can be formed by a direct lithography treatment of the fiber can be provided, and a composition for producing the photosensitive fiber can be provided.

According to the present invention, moreover, a complicated, fine fiber pattern can be obtained conveniently, and a substrate having a complicated, fine fiber pattern on its surface can be provided.

Furthermore, application utilizing not only the fiber pattern processed by a lithography treatment, but also, for example, a 100 nm-50 μm random fine pattern of the fiber forming the fiber pattern (e.g., use as an etching mask utilizing an irregular random fine pattern) can be expected.

The invention claimed is:
1. A fiber comprising
   (A) a polymer compound comprising (A1) structural units represented by formulas (1) and (2):

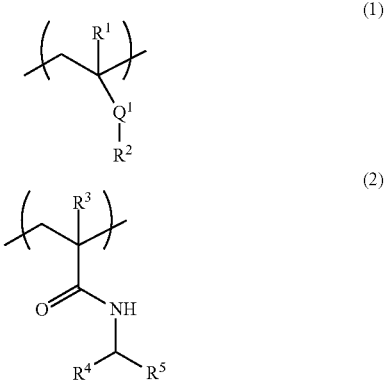

wherein
   $R^1$ is a hydrogen atom or a methyl group,
   $Q^1$ is an ester bond or an amide bond,
   $R^2$ is an alkyl group having 1-10 carbon atoms or an aromatic hydrocarbon group having 6-10 carbon atoms, wherein at least one hydrogen atom is substituted by a hydroxy group, a hydroxymethyl group or an alkoxymethyl group having 1-5 carbon atoms,
   $R^3$ is a hydrogen atom or a methyl group, and
   $R^4$ and $R^5$ are the same or different and each is a hydrogen atom or an alkyl group having 1-4 carbon atoms optionally substituted by a hydroxy group or a carboxy group, and
   (B) a photoacid generator.
2. The fiber according to claim 1, wherein the above-mentioned polymer compound (A1) has a weight average molecular weight of 1,000-1,000,000.
3. The fiber according to claim 1, further comprising (C) a crosslinking agent.
4. The fiber according to claim 1, which is a photosensitive fiber.
5. The fiber according to claim 1, comprising a nano fiber and/or a micro fiber.
6. A fiber pattern formed using the fiber according to claim 1 and a lithography method.
7. A substrate having the fiber pattern according to claim 6 on a surface thereof.
8. A biocompatible material comprising the fiber patterns according to claim 6.
9. A biocompatible material comprising the fiber according to claim 1.
10. A fiber comprising
    (A) a polymer compound that is (A2) a natural polymer per se or comprises (A2) a natural polymer, and
    (B) a photoacid generator.

11. The fiber according to claim 10, wherein the abovementioned (A2) natural polymer comprises at least one kind selected from dextrin and a derivative thereof.

12. The fiber according to claim 10, wherein the abovementioned (A2) natural polymer comprises a biopolymer.

13. A fiber formed from a composition comprising
   (A) a polymer compound comprising a structural unit having, in a side chain, at least one kind of organic group selected from a hydroxy group, a hydroxymethyl group, and an alkoxymethyl group having 1-5 carbon atoms,
   (B) a photoacid generator, and
   (C) a crosslinking agent.

* * * * *